United States Patent [19]
Meyer

[11] Patent Number: 6,032,283
[45] Date of Patent: Feb. 29, 2000

[54] SYSTEM FOR CORRECTING ERRORS IN DATA FRAMES HAVING HORIZONTAL AND VERTICAL PARITY CODES

[75] Inventor: Jacques Meyer, Corenc, France

[73] Assignee: SGS-Thomson Microelectronics S.A., Gentilly, France

[21] Appl. No.: 08/893,217

[22] Filed: Jul. 15, 1997

[30] Foreign Application Priority Data

Jul. 23, 1996 [FR] France .................................. 96 09488

[51] Int. Cl.[7] .................................................. G06F 11/00
[52] U.S. Cl. .......................................... 714/746; 714/799
[58] Field of Search ............................ 371/37–5, 40–11; 714/746, 799, 763

[56] References Cited

U.S. PATENT DOCUMENTS

| | | | |
|---|---|---|---|
| 4,364,081 | 12/1982 | Hashimoto et al. ........................ | 371/30 |
| 4,494,234 | 1/1985 | Patel ........................................ | 371/40.3 |
| 4,791,643 | 12/1988 | Molstad et al. ........................... | 371/39.1 |
| 5,422,895 | 6/1995 | Nguyen et al. ........................... | 371/37.5 |
| 5,592,404 | 1/1997 | Zook ........................................ | 364/746.1 |
| 5,631,914 | 5/1997 | Kashida et al. ........................... | 371/37.4 |
| 5,740,186 | 4/1998 | Widmer .................................... | 371/37.2 |

FOREIGN PATENT DOCUMENTS 0 690 584  1/1996  European Pat. Off. ....... H03M 13/00

OTHER PUBLICATIONS

French Search Report from French Patent Application 96 09488, filed Jul. 23, 1996.

Patent Abstracts of Japan, vol. 013, No. 246 (E–769), Jun. 8, 1989 & JP–A–01 047132 (Sony Corp.)

Patent Abstracts of Japan, vol. 013, No. 246 (E–769), Jun. 8, 1989 & JP–A–01 047131 (Sony Corp.)

*Primary Examiner*—Albert De Cady
*Assistant Examiner*—Shelly A Chase
*Attorney, Agent, or Firm*—Wolf, Greenfield & Sacks, P.C.; James H. Morris; Theodore E. Galanthay

[57] ABSTRACT

The present invention relates to a method for correcting errors in a data frame including horizontal parity data enabling correction of errors in the rows of the frame based on horizontal syndromes calculated on the rows, and vertical parity data enabling correction of errors in the columns of the frame based on vertical syndromes calculated on the columns. The method includes the steps of calculating, on the fly, the horizontal and vertical syndromes of a current frame on the data of the current frame being received in a slow memory, storing these syndromes in a fast memory area, and, as the data of the next frame are being received in the slow memory, finding the values and positions of the errors of the current frame based on the syndromes stored in the fast memory area.

24 Claims, 6 Drawing Sheets

SYSTEM FOR CORRECTING ERRORS IN DATA FRAMES HAVING HORIZONTAL AND VERTICAL PARITY CODES

BACKGROUND OF THE INVENTION

1. Field of the Invention

The present invention relates to a system for correcting errors in data frames including horizontal and vertical parity data for correcting errors in the frame per rows and columns. The data rows and columns of the frame then constitute so-called product-codes.

2. Discussion of the Related Art

FIG. 1 illustrates an example of a frame including rows of 182 bytes and columns of 208 bytes. Ten bytes in each row constitute horizontal parity data HP and sixteen bytes in each column constitute vertical parity data VP. The remaining frame of 172×192 bytes includes the effective data D.

Each row or column, with the corresponding parity data, constitutes, for example, a Reed-Solomon code. With a 2k-parity data Reed-Solomon code, by means of methods well known in the art, 2k error indications can be found, which most often consist in k error values and the k corresponding positions in the code. In the case of product-codes, as in FIG. 1, each Reed-Solomon code can be used in a more flexible way, that is, with 2k parity values, n errors having unknown values and positions, and m errors having known values and unknown positions can be found, with $2n+m \leq 2k$.

To perform an error correction in a code corresponding to a row or a column, a syndrome is calculated based on all the code data, including the parity data. Based on this syndrome, the values and positions of the errors can be calculated in a known manner.

If the number of errors revealed by a syndrome is a maximum number, it may be preferable not to perform the corresponding corrections. Indeed, there is then a probability of approximately $10^{-5}$, horizontally, and of approximately $10^{-8}$, vertically, that the code to be corrected includes more than the maximum number of errors. A correction would then be wrong. To make the probability of miscorrection negligible, several correction passes are performed, in which only the syndromes which reveal a number of errors lower than a threshold which is itself lower than or equal to the maximum number are exploited. For each pass, the erroneous data are corrected and the transverse syndromes affected by the corrections, that is, the vertical syndromes of columns affected by the corrections in a row and the horizontal syndromes of rows affected by corrections in a column, are updated. The number of errors per row or column can thus be reduced below the maximum number of errors correctable by the syndromes.

While awaiting correction, the frame data must be stored. Generally two frames are stored, that is, a first frame being received and a second frame being corrected. In the example of FIG. 1, 2×37856 memory bytes are required. A frame memory with such a capacity is not integrable at reasonable cost with the error correction circuit, and must thus be external. Besides, if no particular precautions are taken, there is a risk of having to access the memory many times during the processing of a frame, which requires a particularly fast, and thus expensive, memory.

SUMMARY OF THE INVENTION

An object of the present invention is to provide a system for correcting errors in frames of product-codes, whose frame memory may be slow, that is, adapted to the frame data transmission rate only.

Another object of the present invention is to provide such a system wherein the frame memory may be incorporated in an existing memory of a circuit for processing the corrected frames.

These and other objects are achieved according to the present invention by a method which includes, according to a first aspect, the steps of calculating, on the fly, the horizontal and vertical syndromes of a current frame based on the data of the current frame being received in a slow memory, storing these syndromes in a fast memory area and, as the data of the following frame are being received in the slow memory, finding the values and positions of the errors of the current frame based on the syndromes stored in the fast memory area.

According to a second aspect independent from the first one, the method includes the steps of, as the data of a current frame are being received by rows, attempting to correct, on the fly, the rows of the current frame by means of the horizontal parity data, marking dubious row positions, calculating, on the fly, the vertical syndromes of the current frame based on the corrected and dubious rows being stored in a slow memory, storing these vertical syndromes in a fast memory area and, as the data of the following frame are being received, finding the values of the errors of the current frame based on the vertical syndromes stored in the fast memory area, the positions of these errors being identified by the marking of the dubious rows.

According to an embodiment of the present invention, the method includes the step of correcting, on the fly, the data extracted from the slow memory with the found values and positions.

According to an embodiment of the present invention, the slow memory is managed by an exploiting circuit and the values and positions of the errors of each frame are supplied to the exploiting circuit among the data of the next frame, the exploiting circuit being adapted to store each frame and correct it upon reception of the values and positions of the corresponding errors.

According to an embodiment of the present invention, each frame is stored without its parity data, the values and positions of the frame errors being supplied to the exploiting circuit during the reception of the parity data of the next frame.

According to an embodiment of the present invention, the vertical parity data are interlaced in the columns, the syndrome calculation including the steps of setting a first auxiliary register to a predetermined element of the Galois field, raised to a power corresponding to the first datum of each column; setting a second auxiliary register to said element of the Galois field, raised to a power corresponding to the first vertical parity datum of the column; setting to 1 a variable register; updating the first auxiliary register with the product of its content by the inverse of said element of the Galois field upon each arrival of a new datum of the column, except upon arrival of a vertical parity datum; updating the second auxiliary register with the product of its content and by inverse of said element of the Galois field upon each arrival of a new vertical parity datum of the column; updating the variable register, for each syndrome coefficient, with the product of its content by the content of the second or first auxiliary register, according to whether the column data currently received is or not a vertical parity datum; and updating, in the fast memory area, each vertical syndrome coefficient with the sum of the syndrome coefficient and of the product of the content of the variable register by the currently received datum.

According to an embodiment of the present invention, the data frame includes error checking signatures, each of which corresponds to the remainder of the division by a generator polynomial of a polynomial whose coefficients are the bits of a series of data of the frame. The method then includes the steps of setting a first register, for each error found, to the coefficients of the generator polynomial and updating it with the square of its content; setting a shift register with the position of the error in said series and clocking it synchronously with the updates of the first register; and setting a signature register to the value of the error and updating it with the product of its content by the content of the first register only when the least significant bit of the shift register is at 1, whereby the signature register contains the influence of the error upon the signature when the shift register has been fully shifted.

According to an embodiment of the present invention, the method, in its first aspect, includes the step of, as the data of the next frame are being received, replacing, in a fast memory area, the coefficients of each syndrome with the values and positions of the errors calculated with the syndrome.

According to an embodiment of the present invention, the method, in its second aspect, includes the steps of, as the data of the next frame are being received, replacing, in the fast memory area, the coefficients of each vertical syndrome with the coefficients of an error determination polynomial calculated with the coefficients of the vertical syndrome and the positions of the marked dubious rows; storing the coefficients of an error locator polynomial calculated with the positions of the marked dubious rows; and calculating the error values with the error determination polynomial and the error locator polynomial.

According to an embodiment of the present invention, the method, in its second aspect, includes the steps of calculating the vertical syndromes of the current frame, the data of each dubious row being canceled and, during the reception of a row of vertical parity data of the next frame, writing the calculated error values for a dubious row into the slow memory in place of this dubious row.

The foregoing and other objects, features and advantages of the present invention will be discussed in detail in the following non-limiting description of specific embodiments of the present invention, in relation with the accompanying drawings.

DETAILED DESCRIPTION

Figure 1:
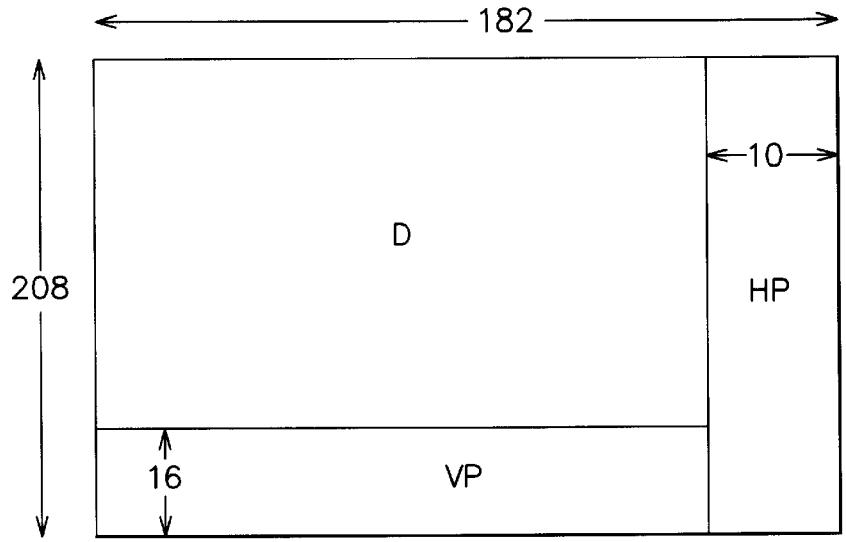
FIG. 1, previously described, illustrates an example of a frame comprised of error correction product-codes.

An aspect of the present invention is to note that, in order to find the errors in a product-code frame, such as that of FIG. 1, it is sufficient to calculate the horizontal and vertical syndromes only once based on all the frame data. Once these syndromes are calculated, the frame data are no longer required to calculate the values and positions of the errors, even if several passes are performed.

Thus, according to this aspect, all error values and positions are first found to subsequently correct the effective data of the frame, based on the sole syndromes. The syndromes are calculated on the fly upon reception of the frame data and are stored in a memory having a capacity such that it may be integrated. Then, the error calculation operations are performed based on the syndromes stored in an integrated memory, the speed of which is particularly high due to the fact that the connections with the memory are short and that the operating frequency is the maximum frequency of the technology. Besides, in an integrated circuit, the computing power can be increased by increasing the size of the access bus to the internal memory, or the number of internal memories, with less restrictions than for external memories.

Accordingly, all processes requiring a high exchange rate with a memory are performed with an integrated memory adapted to such rates, while the external frame memory only sees the relatively slow transmission rate of the frame data. Moreover, the external memory no longer needs to store the parity data.

Figure 2A:
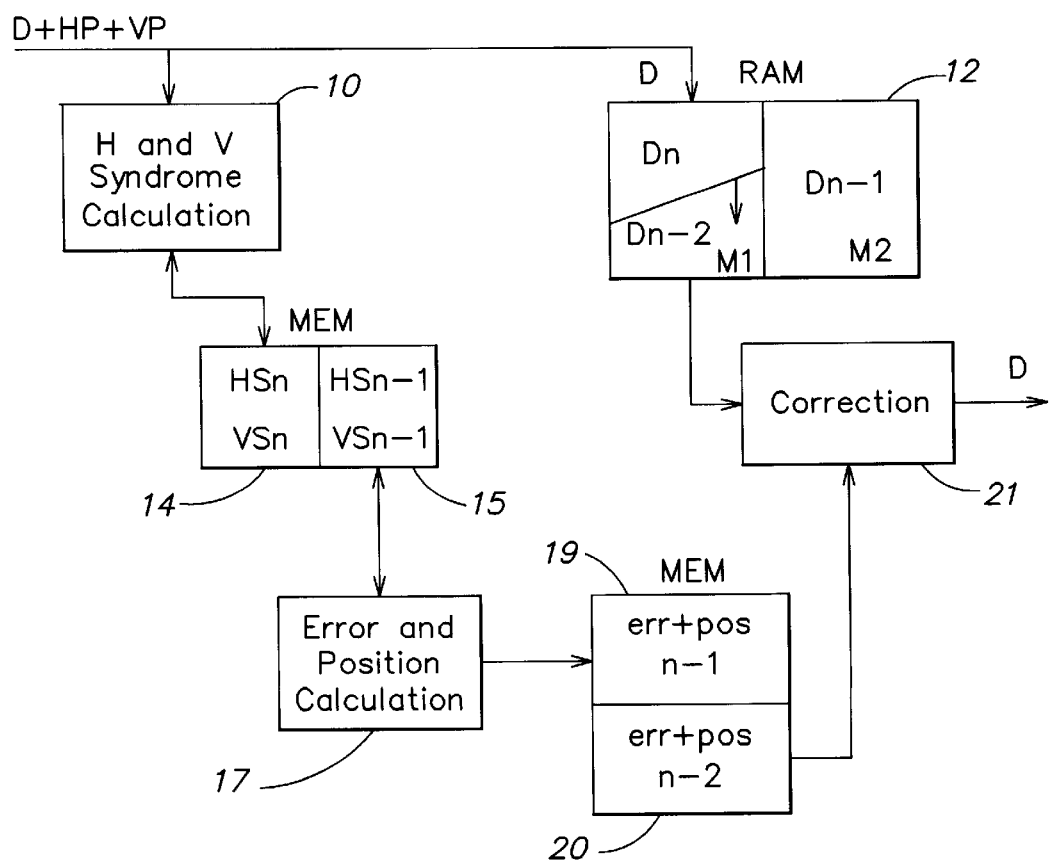
FIG. 2A illustrates a simplified architecture of a first embodiment of an error correction system according to the present invention.

FIG. 2A schematically shows an architecture of a first embodiment of an error correction system according to the present invention. The data of a frame to be processed, that is, the effective data D, the horizontal parity data HP and the vertical parity data VP arrive simultaneously on a syndrome calculation circuit 10 and on an external frame memory 12. Memory 12 includes two areas M1 and M2, each of which is meant for storing the effective data D of one frame.

Syndrome calculation circuit 10 is associated with a first internal memory area 14, wherein currently calculated horizontal syndromes HSn and vertical syndromes VSn are stored. A second internal memory area 15 stores the horizontal and vertical syndromes HSn−1 and VSn−1 calculated for a preceding frame n−1 by circuit 10. An error calculation circuit 17 is associated with this memory area 15 and supplies the values and positions of the errors of frame n−1 to a third internal memory area 19. A fourth internal memory area 20 stores the values and positions of the errors previously calculated for a frame n−2 by circuit 17. An error correction circuit 21 receives from external memory 12 the effective data D of the frame n−2 to be transmitted and receives the values and positions of the corresponding errors of memory area 20.

Upon reception of a current frame n, the effective data Dn of the frame are written into one of the areas of external memory 12, for example, area M1, while the data Dn−2 previously stored in this area M1, belonging to the penultimate frame n−2, are transmitted and corrected by correction circuit 21. Area M2 of external memory 12 stores the effective data Dn−1 of the previous frame n−1. Areas M1 and M2 are used circularly, that is, the following frame n+1 will be stored into area M2 while frame n−1 is transmitted and corrected.

Upon each reception of a datum (1 byte) of current frame n, calculation circuit 10 updates the corresponding horizontal and vertical syndromes in internal memory area 14. A syndrome has as many coefficients or bytes as there are parity data in the corresponding code. In the case of FIG. 1, each horizontal syndrome includes 10 bytes and each vertical syndrome includes 16 bytes. Thus, the updating of a horizontal syndrome and of a vertical syndrome implies reading 26 bytes from memory area 14 and writing back these 26 bytes updated. This costs 52 byte accesses for each datum, that is, near two million byte accesses for the entire frame. The calculation of the syndromes on the fly is one of the tasks which requires the most computing power in the system. This computing power may be adapted by increasing the number of bytes processed in parallel, that is, the width of the bus of memory area 14 (and 15).

Memory areas 14 and 15 are used circularly, that is, upon reception of frame n+1, syndrome calculation circuit 10 updates the syndromes of frame n+1 in memory area 15 and error calculation circuit 17 uses the horizontal and vertical syndromes HSn and VSn of memory area 14.

To calculate the error values and positions, calculation circuit 17 performs, for example, two passes in order to avoid miscorrection risks. In the first pass, it only exploits the syndromes which reveal a number of errors smaller than the maximum number of correctable errors. In the case of FIG. 1, it exploits the horizontal syndromes which reveal, for example, at most 4 errors and the vertical syndromes which reveal, for example, at most 7 errors. In the second pass, it is very likely that the remaining errors may be calculated.

More specifically, for each syndrome and in each pass, error calculation circuit 17 performs the following operations. The syndrome bytes are read from memory area 15 and stored in a register in order to be processed conventionally to find the values and positions of the errors, as described, for example, in French patent application 2,721, 775. The values and positions found are temporarily stored during the syndrome processing.

At the end of the syndrome processing, it is known whether the errors are correctable or not, and how many there are. If the number of errors found is lower than the maximum number, the values and positions are stored in area 19, the syndrome just processed is deleted in area 15, and the affected transverse syndromes are updated. In the opposite case, the processing just performed is ignored and the following syndrome is considered.

In the case of a Reed-Solomon coding, for every error $e_{rc}$ found (where r designates the row containing the error and c the column containing the error), each byte $S_v$ of a vertical transverse syndrome (v=0 to 15 in the case of FIG. 1) is modified according to the following relation:

$$S_v = S_v + \alpha^{rv} e_{rc}$$

where $\alpha$ is a predetermined non-zero and non-unity element of the Galois field on which the used Reed-Solomon codes are defined. Similarly, each byte $S_h$ of a horizontal transverse syndrome (h=0 to 9 in the case of FIG. 1) is modified according to the following relation:

$$S_h = S_h + \alpha^{ch} e_{rc}.$$

Such an updating of a transverse syndrome corresponds to a situation where the erroneous datum would have been corrected at the position (r, c) of a stored frame and where the horizontal or vertical syndrome would have been recalculated based on row r or on column c. Thus, according to the present invention, the transverse syndromes are updated by mere multiplication and addition operations on each of the syndrome coefficients instead of recalculating each syndrome coefficient from each of the data in the corresponding column or row.

Such calculations imply a significant number of accesses to the syndrome bytes in memory area 15 for each error. However, since the number of errors is low with respect to the number of data in a frame, the required computing power is in practice lower than that of circuit 10 for calculating the syndromes on the fly.

Correction circuit 21 reads the data of frame n–2, stored in area M1 of external memory 12, in order to correct them as they are being transmitted. For each datum received by correction circuit 21, circuit 21 checks in memory area 20 whether an error position is associated with the datum. If it is the case, the datum is corrected with the corresponding error. Several methods may be used to access the values and positions of the errors stored in memory area 20 in the order corresponding to the data to be transmitted.

Memory areas 19 and 20 are used circularly, that is, upon reception of frame n+1, error calculation circuit 17 stores the values and positions of the errors of frame n in memory area 20 and circuit 21 corrects frame n–1 based on the values and positions of the errors stored in memory area 19.

Figure 2B:
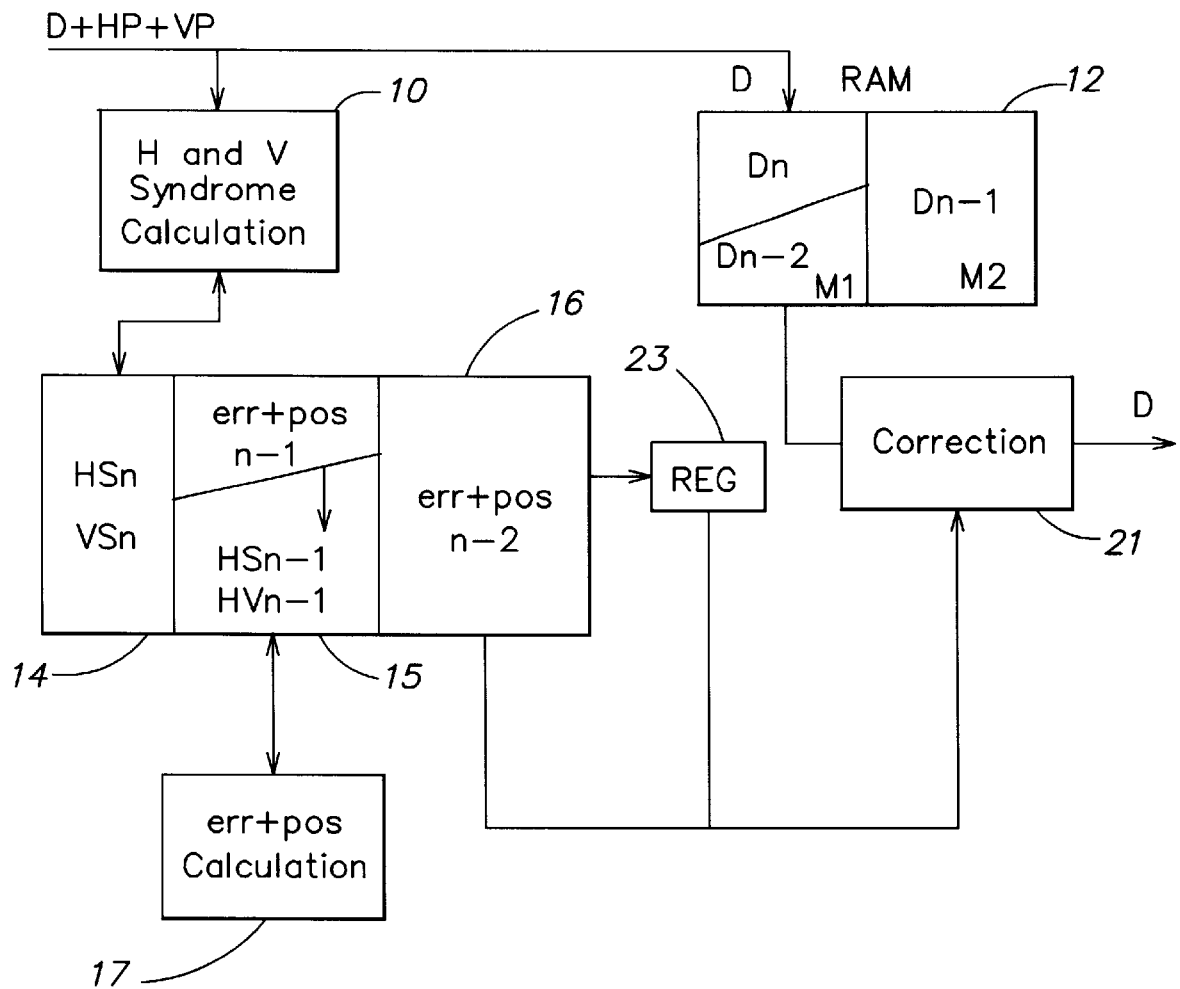
FIG. 2B illustrates an advantageous alternative embodiment of FIG. 2A.

FIG. 2B illustrates an alternative of the architecture of FIG. 2A which has the advantage of providing the error values and positions to correction circuit 21 in the right order, while requiring little hardware and computing power.

The architecture of FIG. 2B includes, besides the two syndrome areas 14 and 15, an additional syndrome area 16. Memory areas 19 and 20 of FIG. 2A are incorporated into two of the three syndrome areas 14 to 16. Further, several flags are associated with each syndrome, that is, at least one "too many errors" flag which indicates that the associated syndrome does not allow correction of the errors and one "errors corrected" flag indicating that the associated syndrome allowed correction of the errors. Preferably, a "no error" flag indicating that the syndrome is zero is also provided.

Upon each reception of a datum of current frame n, calculation circuit 10 updates the corresponding horizontal and vertical syndromes in memory area 14. These syndromes are calculated in the way described in relation with FIG. 2A.

Memory area 15, at the beginning of the reception of the data of frame n, contains the horizontal and vertical syndromes calculated for the preceding frame n–1. During the reception of frame n, error calculation circuit 17 successively processes the syndromes contained in area 15.

Several cases then arise:

The syndrome is zero. There is thus no error. The "no error" flag is enabled.

The syndrome indicates too many errors, either because the number of errors is higher than the number of correctable errors, or because the number of errors is equal to the maximum number of correctable errors. The syndrome is then left unchanged and its "too many errors" flag is enabled.

The number of errors is acceptable. Calculation circuit 17 then conventionally determines the error values and positions and updates the transverse syndromes. The values and positions of the found errors are stored at the location of the syndrome and the "errors corrected" flag of the syndrome is enabled. The error values and positions are preferably stored consecutively at the locations of the syndrome coefficients.

Memory area 16 stores the values and positions of the errors thus found for frame n–2 which is being transmitted and corrected by circuit 21.

The rank of each datum transmitted by circuit 21 directly supplies the addresses of the corresponding horizontal and vertical syndromes in area 16, which syndromes have been replaced with the values and positions of the errors found in the row and column of the currently transmitted datum. Thus, to correct the transmitted datum, it is sufficient to scan the errors stored at the locations of the corresponding horizontal and vertical syndromes, until the stored error position corresponds to the rank of the datum. In the example of FIG. 1, at most five horizontal errors and eight vertical errors are scanned before the error corresponding to the transmitted datum is found. Of course, if no corresponding error position is found, the datum does not have an error.

In practice, the flags of the horizontal and vertical syndromes corresponding to the transmitted datum are exploited as follows:

The "errors corrected" flag is enabled for each of the two syndromes: the horizontal and vertical errors are all scanned.

The "no errors" flag is enabled for each of the two syndromes: the datum does not have an error.

The "too many errors" flag is enabled for each of the two syndromes: the datum has an uncorrectable error.

The "too many errors" flag is enabled for one of the syndromes and the "errors corrected" flag is enabled for the other: the datum may have a correctable error and only the errors associated with the syndrome for which the "errors corrected" flag is enabled are scanned.

Conventional error calculation methods enable finding of the errors in the data transmission order. Thus, by transmitting the data by rows, it may be sufficient to only scan one horizontal error for each transmitted datum. That is, a single horizontal error is preselected for checking and the arrival of the corresponding datum is awaited prior to preselecting the following horizontal error for checking. For this purpose, for example, an error register 23 is provided, in which the value and position of the first error is stored as soon as the first datum of a row is transmitted. For each transmitted datum, it is checked whether it is associated with the error contained in register 23. If it is, the transmitted datum is corrected and the content of register 23 is replaced with the following horizontal error.

Memory areas 14 to 16 are used circularly. That is, upon reception of frame n+1, syndrome calculation circuit 10 updates the syndromes in area 15, error calculation circuit 17 uses area 16 to find and store the errors, and correction circuit 21 uses area 14.

In most cases where product-code flames are used, the circuit which exploits the corrected frames has a programmable component, such as a microcontroller or a microprocessor, and an associated memory.

Figure 3:
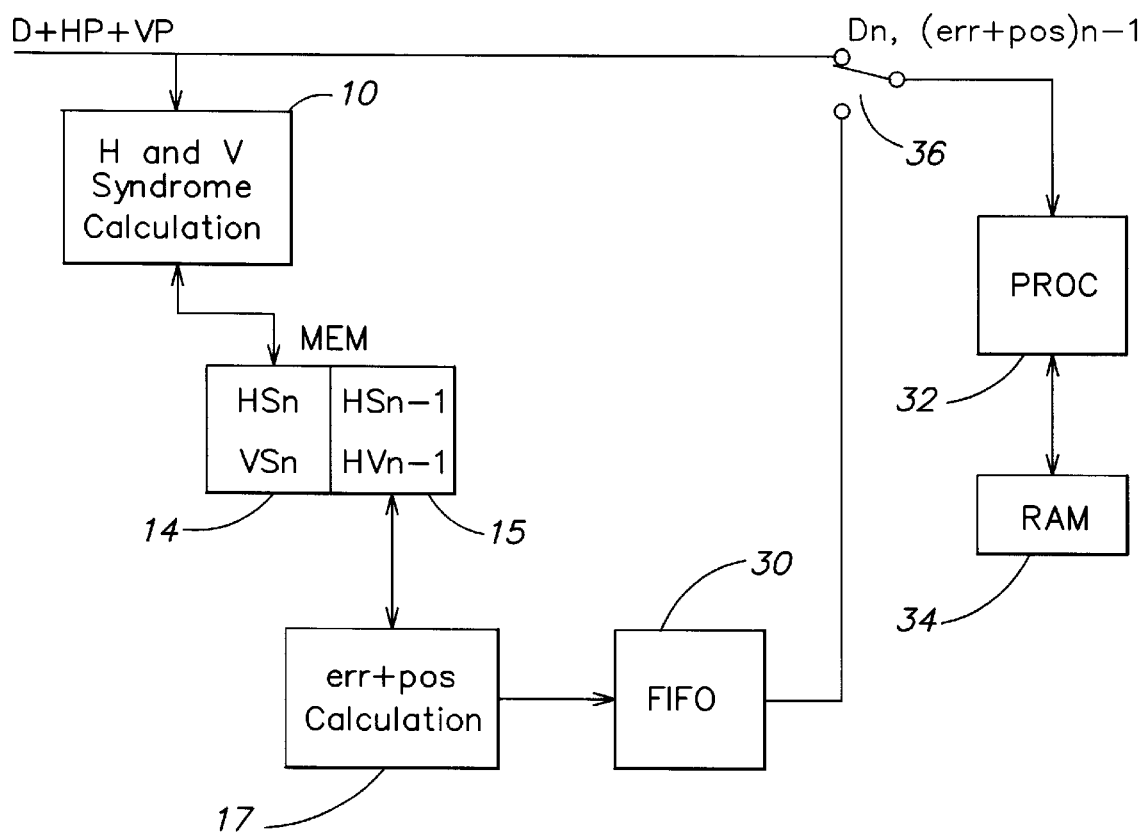
FIG. 3 illustrates a simplified architecture of a second embodiment of an error correction system according to the present invention.

FIG. 3 shows an embodiment of the present invention enabling use of the memory of the exploiting circuit to store the data of the flame prior to correction. In other words, external memory 16 of FIG. 2A is incorporated in the memory of the exploiting circuit. Such an exploiting circuit is, for example, an MPEG decoder or a microcomputer whose memory, in abundant quantity, has enough free room to store the frames prior to error correction, or can be increased at low cost.

The system of FIG. 3 includes syndrome calculation circuit 10, integrated memory areas 14 and 15, and error calculation circuit 17, already described in relation with FIG. 2A. However, the system of FIG. 3 includes neither external memory 12, nor correction circuit 21. Memory areas 19 and 20 used to store the error values and positions are replaced with a buffer memory 30. The circuit exploiting the data flame includes a processor 32 associated with a memory 34.

Upon reception of a current frame n, the effective data Dn are transmitted directly to processor 32 via a switch or multiplexer 36. Meanwhile, syndrome calculation circuit 10 updates, as in FIG. 2A, the horizontal and vertical syndromes of flame n in memory area 14, and error calculation circuit 17 finds the values and positions of the errors of the preceding frame n−1 based on the syndromes stored in memory area 15. The error values and positions are temporarily stored in buffer memory 30 until they are transmitted to processor 32 via switch 36.

Switch 36 selects the output of buffer memory 30 while the horizontal parity data HP and the vertical parity data VP of current frame n are arriving. Thus, processor 32 receives the effective data Dn of the current frame and, among these data, the values and positions of the errors of the preceding frame n−1. The sum of the time intervals during which the parity data of a frame arrive is generally sufficient to transmit all the values and positions of the errors of the preceding frame.

Processor 32 is programmed to store in an area of its memory 34 current frame n and the preceding frame n−1 and to correct the data of the preceding frame n−1 by means of the values and positions of the errors received among the data of current frame n.

In common applications, processor 32 may be that of an MPEG decoder, of a microcomputer, or that which controls the so-called "elastic" buffer in a digital video disk (DVD) drive.

Figure 4:
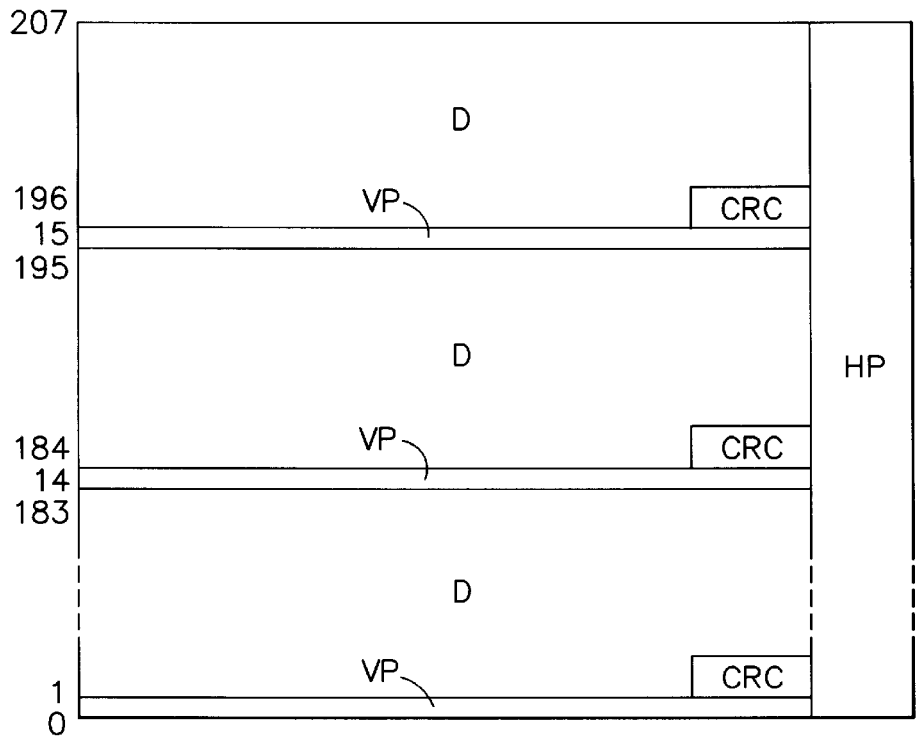
FIG. 4 illustrates a data frame wherein the vertical parity data rows are interlaced with the effective data rows.

As shown in FIG. 4, in some applications, the rows of vertical parity data VP may be interlaced with the rows of effective data D. This happens especially for the data stored on digital video disks DVD. Thus, each thirteenth data row of the frame is a vertical parity data row. The ranks of the rows of vertical parity data VP range from 0 to 15 and the ranks of the rows of effective data D range from 16 to 207. As indicated in FIG. 4, row 15 is between rows 195 and 196, row 14 is between rows 183 and 184, etc.

Figure 5:
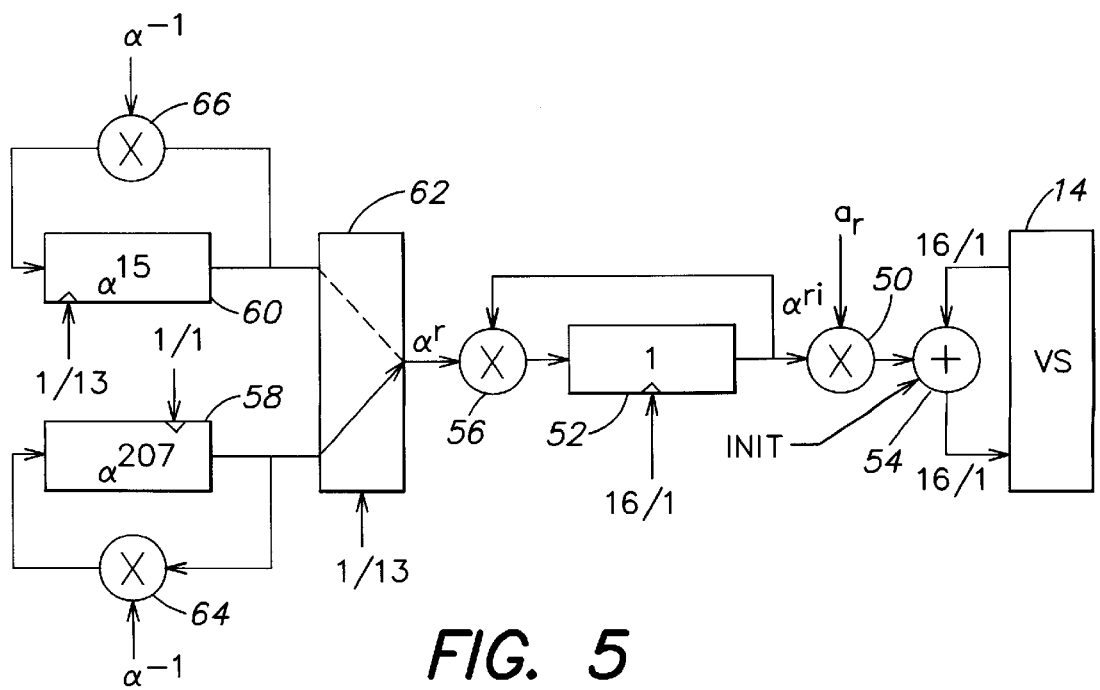
FIG. 5 schematically shows an embodiment of a circuit for calculating syndromes on the fly for frames of the type in FIG. 4.

FIG. 5 schematically shows a circuit for calculating on the fly the vertical syndromes in the case of FIG. 4. The i-th coefficient of a syndrome is expressed as:

$$S_i = a_{207} \alpha^{207i} + a_{206} \alpha^{206i} + \ldots + a_r \alpha^{ri} + \ldots + a_0$$

where $a_r$ is the datum of rank r in the column where the syndrome is calculated, and $\alpha$ is a predetermined non-zero and non-unity element of the Galois field on which the error correction code is defined. The circuit of FIG. 5 is meant to update each syndrome coefficient $S_i$ by replacing it with $S_i + a_r \alpha^{ri}$.

The data $a_r$ of the column arrive successively, generally by decreasing ranks r, on a multiplier 50 where each data is multiplied by the adequate power of $\alpha$ stored in a register 52. An adder 54 receives the output of multiplier 50 and each of the syndrome coefficients to be modified in memory area 14. The updated syndrome coefficient is supplied by adder 54 to memory area 14 where it overwrites the preceding coefficient. A multiplier 56 updates the content of register 52 with the product of its content by the content of one or the other of two registers 58 and 60 selected by a multiplexer 62. A multiplier 64 updates the content of register 58 with the product of its content by constant $\alpha^{-1}$. A multiplier 66 performs the same operation on register 60.

Upon arrival of the first datum $a_{207}$ of a column, register 52 is set to 1, register 58 to $\alpha^{207}$ and register 60 to $\alpha^{15}$. Multiplexer 62 selects register 58, that is, value $\alpha^{207}$.

Upon each reception of a new datum of the column, register 58 is enabled, which is illustrated by a signal 1/1. Accordingly, upon reception of datum $a_r$ of the column, where r is decreasing, register 58 contains value $\alpha^r$. For each thirteenth datum of the column, multiplexer 62 is switched, during the reception time of this thirteenth datum, to register 60 which is enabled at the same time. The switching of multiplexer 62 and the enabling of register 60 are illustrated by a signal 1/13. Thus, multiplexer 62 always supplies the adequate term $\alpha^r$, corresponding to the current datum of the column, and taking the interlacing into account.

For each datum $a_r$ in the column, register 52 is set to 1, and then enabled 16 times, that is, once for each syndrome coefficient, which is illustrated by a signal 16/1. Thus, register 52 successively contains the terms $\alpha^{ri}$, for i varying from 0 to 15, required to update the 16 syndromes $S_i$. The 16 terms $\alpha^{ri}$ are multiplied by datum $a_r$ before being presented to adder 54 which further receives the 16 syndrome coefficients stored in memory area 14 for updating.

At the beginning of a column, adder 54 is set by a signal INIT so as to add value 0 to the output of multiplier 50, and not the 16 syndrome coefficients calculated for the preceding column.

The same circuit as in FIG. 5, without elements 60, 62, and 66 which are provided to take the interlacing into account, may be used to calculate the horizontal syndromes, register 58 then being set at $\alpha^{181}$. A simpler circuit of the polynomial counter type will however be preferred, which updates each syndrome coefficient $S_i$ with value $\alpha^i S_i + a_c$, where c is the (decreasing) rank of the datum received in the row on which the syndrome is calculated.

A circuit of the type of FIG. 5, without elements 60, 62, and 66, may also be used to update the syndromes according to the found errors. The errors are then supplied to multiplier 50 instead of the data a. For each error $e_j$, where j is the (decreasing) rank of the error in the row or column for which the syndrome should be updated, register 58 is first enabled a number of times "off-load", that is, without enabling register 52 nor accessing memory area 14, so that register 58 reaches the value $\alpha^j$ corresponding to the error. The number of off-load enablings is 207-j for a column and 181-j for a row.

In the case of a digital video disk, as shown in FIG. 4, each slice of 12 effective data rows ends with a 32-bit signature or CRC which was initially calculated on all the bits in the slice. This CRC is used to check whether the slice errors are effectively corrected.

Each CRC corresponds to the remainder of the division of a polynomial, the coefficients of which are the bits of the associated slice, by a generator polynomial of degree 32. In the case of digital video disks, the generator polynomial is $x^{32}+x^3 1+x^4+1$. Thus, normally, once the data have been corrected, the CRCs are calculated again to check if they effectively correspond to the initial CRCs.

The CRC check calculation is performed by supplying the consecutive bits of the corrected slice, for example, after correction circuit 21 of FIG. 2A, to a linear feedback shift register (LFSR). However, in the embodiment of FIG. 3, the corrected slices are not available in the correction system. Only the non-corrected slices and the error values and positions are available.

Figure 6:
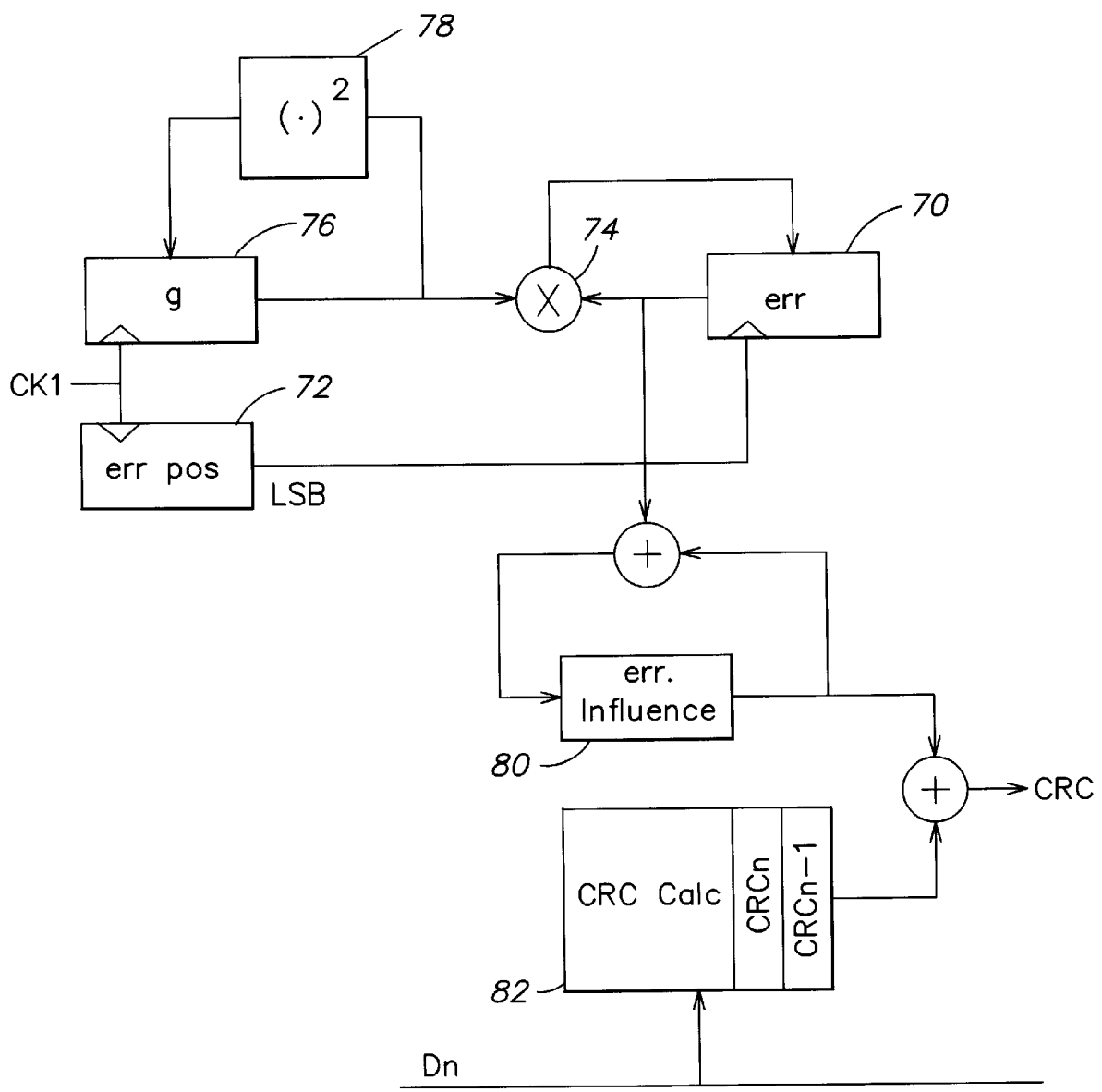
FIG. 6 shows an embodiment of a circuit for calculating the influence of an error upon a signature for checking the absence of errors in an application of the embodiment of FIG. 3.

FIG. 6 illustrates an example of a circuit that enables finding of the CRCs of the corrected slices based on the errors and the signatures of the non-corrected slices.

The circuit of FIG. 6 is based on the decomposition in a sum of powers of two of the position of an erroneous bit in the slice. If a bit located at position x in the slice has an error e, the influence of this error on the CRC is expressed as $eg^x$, where g is the generator polynomial. The circuit of FIG. 6 enables a particularly fast calculation of this influence and uses little silicon surface area.

A 32-bit register 70 is loaded with the error e whose influence on the CRC of a slice should be calculated. The errors being found by bytes and the signatures being calculated over 32 bits, each error byte of rank x in the slice is formatted according to a 32-bit error word e, whose byte of weight x modulo 4 contains the error byte, the other bytes in the word being zero. This error word e is loaded into register 70. In a shift register 72, the rank i of the error word in the slice is loaded, where i=x/4. Thus, rank i varies from 0 to 514 (the CRC word being excluded from the slice), which requires a 10-bit shift register 72. The least significant bit LSB of shift register 72 enables the updating of register 70. A 32-bit multiplier 74 receives, for updating register 70, the content of this register 70 and the content of a register 76. Register 76 initially contains the coefficients of generator polynomial g. A squaring circuit 78 receives the content of register 76 to replace it with its square. Registers 76 and 72 are enabled by a same clock signal CK1.

To find the influence of the error, clock signal CK1 is asserted 10 times, to fully shift the content of shift register 72. Register 76 then contains the 1024-th power of the generator polynomial. Register 70 will only have been enabled for the bits at 1 of shift register 72 and contains the error multiplied by $g^i$.

The following table illustrates, in the case of an example where i=145, the successive contents of registers 72, 76 and 70:

| REGISTER 72 | REGISTER 76 | REGISTER 70 |
| --- | --- | --- |
| 10010001 | g | e |
| 1001000 | $g^2$ | eg |
| 100100 | $g^4$ | eg |
| 10010 | $g^8$ | eg |
| 1001 | $g^{16}$ | eg |
| 100 | $g^{32}$ | $eg \cdot g^{16} = eg^{17}$ |
| 10 | $g^{64}$ | $eg^{17}$ |
| 1 | $g^{128}$ | $eg^{17}$ |
| 0 | $g^{256}$ | $eg^{17} g^{128} = eg^{145}$ |
| 0 | $g^{512}$ | $eg^{145}$ |
|  | $g^{1024}$ | $eg^{145}$ |

Each error influence thus obtained in register 70 is accumulated in a register 80 for each data slice. A conventional CRC calculation circuit 82 temporarily stores the signature CRCn−1 calculated on the basis of the non-corrected data Dn−1 of the preceding slice, while it calculates signature CRCn on the basis of the non-corrected data Dn of the current slice. The rectified CRC 14 is obtained by adding signature CRCn−1 to the signature contained in register 80. This rectified CRC is compared with the original CRC.

Squaring is a particularly simple operation in a Galois field. Thus, squaring circuit 78 occupies a small silicon surface area. A multiplication of two 32-bit numbers on the Galois field is relatively complex if it should be performed in one cycle. It will be preferred to use a series-type multiplier 74 which performs the multiplication in 32 cycles, but whose structure is particularly simple. Thus, the influence of each error on the signature is obtained in 10×32=320 cycles, which however amounts to a lower computing power than that of syndrome calculation circuit 10, due to the low number of errors.

The system according to the present invention which has just been described enables correction of frames of the type of FIG. 1 having an error ratio of approximately 2% with two horizontal and vertical correction passes. In some applications, such as digital video disks, the maximum error ratio is significantly lower. As a result, the above-described error correction system would be oversized for such applications.

Figure 7:
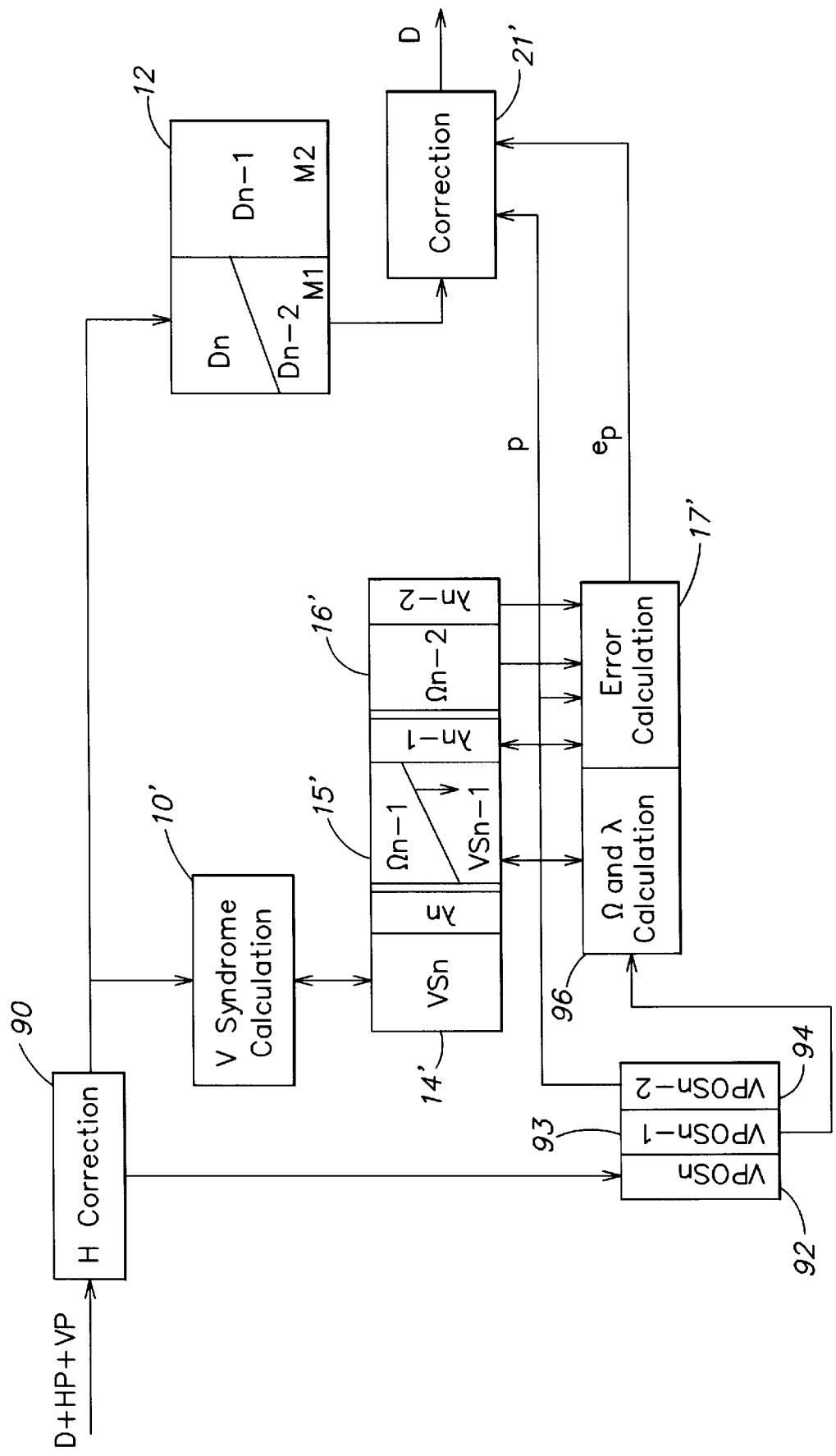
FIG. 7 illustrates a simplified architecture of a third embodiment of an error correction system according to the present invention.

FIG. 7 shows an embodiment of a correction system according to the present invention which enables correction of flames of the type of FIG. 1 having an error ratio of 0.8%. This system is similar to that of FIG. 2B in that it includes a syndrome calculation circuit 10', an external frame memory 12, internal memory areas 14' to 16', an error calculation circuit 17', and a correction circuit 21'.

The data of a current frame n to be corrected arrive on a horizontal correction circuit 90 which corrects on the fly the frame rows by means of the horizontal parity data HP. Circuit 90 is a correction circuit of conventional type for correcting "monodimensional" codes. However, as previously explained, circuit 90 will not perform any correction if a row has the maximum number of errors (5 in FIG. 1) or more. In this case, correction circuit 90 writes the rank VPOS of the row in a memory 92. The entire row will be considered as dubious. Two similar additional memories 93 and 94 store the positions of dubious rows of the two preceding frames n−1 and n−2.

Syndrome calculation circuit 10' only calculates, on the fly, the vertical syndromes VS based on the horizontally-corrected data supplied by correction circuit 90. The vertical syndromes, in the way previously described, are calculated by successive updates of one (here 14') of memory areas 14' to 16' used circularly.

The marking of the dubious rows not corrected by horizontal correction circuit 90 directly supplies the positions of possible errors in the columns and each vertical syndrome will enable to find the values of the errors in its associated column. Thus, in the example of FIG. 1, each vertical syndrome will enable to find at most 16 error values. If horizontal correction circuit 90 has marked more than 16 non-corrected rows, the errors will not be correctable.

Knowing the positions of dubious rows significantly simplifies the vertical error correction procedure.

In a Reed-Solomon coding, the errors and syndromes are linked by the following relation:

$$\lambda(x)S(x)=\Omega(x)$$

where $\lambda(x)$ is a so-called error locator polynomial and $\Omega(x)$ is a polynomial that enables finding the error values. Polynomial $\lambda(x)$ is formed by the product of terms $1+x\alpha^p$, where $\alpha$ is a non-zero and non-unity element of the Galois field, and p is the position of an error in the column. When the error values and positions are unknown, the two polynomials $\lambda$ and $\Omega$ must be determined by implementing the so-called Euclide algorithm. This represents a large number of calculations. Conversely, when the positions are known, polynomial $\lambda$ is directly known, and polynomial $\Omega$ is directly obtained from the above relation.

The error values are expressed as:

$$e_p = \frac{\Omega(\alpha-p)}{\alpha-p \cdot \lambda'(\alpha-p)} \quad (1)$$

where $\lambda'(x)$ is the derived polynomial of polynomial $\lambda$. Polynomial $x\lambda'(x)$ is comprised of the sole odd power terms of polynomial $\lambda(x)$.

When the vertical syndromes of a frame n are calculated in area 14', a circuit 96 for calculating polynomials $\Omega$ and $\lambda$ uses area 15' associated with frame n−1 while error calculation circuit 17' uses area 16' associated with frame n−2.

Each of areas 14' to 16' includes an additional area for receiving the coefficients of the polynomial $\lambda$ associated with a frame. This polynomial $\lambda$ is common to all the columns in the frame, since the positions of possible errors are the same in each column. In memory area 14', the polynomial $\lambda$ of slice n has not been calculated yet. In area 15', the coefficients of the polynomial $\lambda$ associated with slice n−1 are being calculated. Finally, in area 16', the polynomial $\lambda$ associated with slice n−2 is exploited by error calculation circuit 17' to calculate the error values.

In memory area 15', calculation circuit 96 replaces each vertical syndrome with the corresponding polynomial $\Omega$. For this purpose, circuit 96 reads each error position p from memory 93 and calculates the polynomial $\Omega$ associated with each column by successive updates according to the following relation:

$$\Omega(x)=(1+x\alpha^p)\Omega(x)$$

where p successively takes all error positions and $\Omega(x)$ is initially equal to the syndrome $S(x)$ associated with the column. Similarly, polynomial $\lambda$ is updated according to the following relation:

$$\lambda(x)=(1+x\alpha^p)\lambda(x),$$

$\lambda(x)$ being initially equal to 1 (unity polynomial).

More concretely, each coefficient $\Omega_j$ is modified according to the following relation:

$$\Omega_j=\Omega_j+\alpha^p\Omega_{j-1},$$

where, in the example of FIG. 1, j varies from 15 to 0 for each error position p. The coefficients of polynomial $\lambda$ are updated according to the same relation.

Error calculation circuit 17' exploits the polynomials $\Omega$ respectively associated with the columns and common polynomial $\lambda$ stored in area 16' to calculate the successive error values $e_p$ of the dubious rows of frame n−2. Concretely, the numerator N of the ratio of the above relation (1) is stored in a register which is updated according to the following relation:

$$N_p=\alpha^{-p}N_p+\Omega_j$$

where j varies from 15 to 0 for each error position p found in memory 94. By varying p in the order of storage of the positions in memory 94, the error values $e_p$ will be obtained in the row transmission order.

The denominator of the above relation (1) is updated similarly based on polynomial $\lambda$, except that index j varies from 15 to 1 by odd values. Then, the denominator is conventionally inverted and multiplied by the numerator.

Correction circuit 21' receives, from memory area 94, the positions p of the dubious rows. When a position p corresponds to the row being transmitted, the error values $e_p$ supplied by calculation circuit 17' are respectively added to the data transmitted by correction circuit 21'.

According to an alternative of the embodiment of FIG. 7, if enough computing power is available, the third memory area 16' and correction circuit 21' may be omitted. Then, error calculation circuit 17' acts on memory area 15' after circuit 96 has written polynomials $\Omega$ and $\lambda$ into area 15'. All the data in a dubious row are assumed to be null, even those which are unambiguously correct, and the vertical syndromes are calculated talking this into account. As a result, the error values found by circuit 17' are directly the correct data of the dubious rows. Circuit 96 must have calculated all polynomials $\Omega$ and circuit 17' must have calculated all the error values in a first dubious row prior to the arrival of the first vertical parity row of frame n. Indeed, during the reception of each vertical parity row, which is not written into area M1 of memory 12, correction circuit 17' writes into area M2, in place of a dubious row of frame n−1, the error values of the dubious rows. The dubious rows are thus corrected in memory 12 without it being necessary to increase the access speed of memory 12.

Of course, the embodiment of FIG. 7 and its alternative may, as for the embodiment of FIG. 3, be used with a processor 32 associated with a memory 34 into which the frames awaiting correction are sent.

The present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for correcting errors in a data frame including horizontal parity data enabling correction of errors in rows of the frame based on horizontal syndromes calculated on the rows, and vertical parity data enabling correction of errors in columns of the frame based on vertical syndromes calculated on the columns, the method including the steps of:

calculating, on the fly, the horizontal and vertical syndromes of a current frame based on data of the current frame being received in a slow memory and storing these syndromes in a fast memory area; and as the data of a next frame are being received in the slow memory, finding values and positions of errors of the current frame based on the syndromes stored in the fast memory area, wherein the slow memory is managed by an exploiting circuit and the values and positions of the errors of each frame are supplied to the exploiting circuit among the data of the next frame, the exploiting circuit being adapted to store each frame and correct it upon reception of the values and positions of the corresponding errors;

wherein the parity data constitute, with the remaining data, Reed-Solomon codes, each coefficient of a syndrome calculated on a row or a column of the frame being the value taken by a polynomial having coefficients constituted by the data of the row or column, for an element of a Galois field raised to a corresponding power, and wherein the vertical parity data are interlaced in the columns, the syndrome calculation including the steps of:

setting a first auxiliary register to a predetermined element of the Galois field, raised to a power corresponding to the first datum of each column;

setting a second auxiliary register to said element of the Galois field, raised to a power corresponding to the first vertical parity datum of the column;

setting to 1 a variable register;

updating the first auxiliary register with a product of its content and the inverse of said element of the Galois field upon each arrival of a new datum of the column, except upon arrival of a vertical parity datum;

updating the second auxiliary register with a product of its content and the inverse of said element of the Galois field upon each arrival of a new vertical parity datum of the column;

updating the variable register, for each syndrome coefficient, with a product of its content and the content of the second or first auxiliary register, according to whether the column datum currently received is or is not a vertical parity datum; and updating, in the fast memory area, each vertical syndrome coefficient with a sum of the syndrome coefficient and of the product of the content of the variable register by the currently received datum.

2. A method for correcting errors in a data frame including horizontal parity data enabling correction of errors in rows of the frame based on horizontal syndromes calculated on the rows, and vertical parity data enabling correction of errors in columns of the frame based on vertical syndromes calculated on the columns, the method including the steps of:

calculating, on the fly, the horizontal and vertical syndromes of a current frame based on data of the current frame being received in a slow memory and storing these syndromes in a fast memory area; and as the data of a next frame are being received in the slow memory, finding values and positions of errors of the current frame based on the syndromes stored in the fast memory area;

wherein the slow memory is managed by an exploiting circuit and the values and positions of the errors of each frame are supplied to the exploiting circuit among the data of the next frame, the exploiting circuit being adapted to store each frame and correct it upon reception of the values and positions of the corresponding errors;

wherein the data frame includes error checking signatures, each of which corresponds to a remainder of a division by a generator polynomial of a polynomial having coefficients that are the bits of a series of data of the frame, including the steps of:

setting a first register, for each error found, to the coefficients of the generator polynomial and updating it with the square of its content;

setting a shift register with a position of the error in said series and clocking it synchronously with the updates of the first register; and setting a signature register to the value of the error and updating it with the product of its content and the content of the first register only when a least significant bit of the shift register is at 1, whereby the signature register contains an influence of the error upon the signature when the shift register has been fully shifted.

3. A method for correcting errors in a data frame including horizontal parity data enabling correction of errors in rows of the frame based on horizontal syndromes calculated on the rows, and vertical parity data enabling correction of errors in columns of the frame based on vertical syndromes calculated on the columns, the method including the steps of:

as data of a current frame are being received by rows, attempting to correct, on the fly, the rows of the current frame by means of the horizontal parity data and marking the positions of dubious rows;

calculating, on the fly, the vertical syndromes of the current frame based on the corrected and dubious rows being stored in a slow memory and storing the vertical syndromes in a fast memory area;

as data of a next frame are being received, finding values of a errors of the current frame based on the vertical syndromes stored in the fast memory area, the positions of these errors being provided by the marking of the dubious rows; and as data of the next frame are being received, replacing, in the fast memory area, coefficients of each vertical syndrome with coefficients of an error determination polynomial calculated with the coefficients of the vertical syndrome and the positions of the marked dubious rows;

storing coefficients of an error locator polynomial calculated with the positions of the marked dubious rows; and calculating the error values with the error determination polynomial and the error locator polynomial.

4. The error correction method according to claim 3, including the steps of:

calculating the vertical syndromes of the current frame, the data of each dubious row being canceled; and during reception of a row of vertical parity data of the next frame, writing the calculated error values for a dubious row into the slow memory in place of this dubious row.

5. An error correcting system, comprising:

a first memory area for storing syndromes currently calculated horizontal syndromes HSn and vertical syndromes VSn;

a second memory area for storing the horizontal and vertical syndromes HSn−1 and VSn−1 calculated for a preceding frame n−1;

an input terminal for receiving an input signal including the data D of a flame to be processed, the horizontal parity data HP and the vertical parity data VP;

a syndrome calculation circuit for receiving said input signal and for storing currently calculated horizontal syndromes HSn and vertical syndromes VSn;

a frame memory for receiving said input signal and including two areas, each of which is meant for storing the effective data D of one frame;

an error calculation circuit associated with said second memory area;

a third memory area for storing the values and positions of the errors of frame n−1 supplied from said error calculation circuit;

a fourth memory area for storing the values and positions of the errors previously calculated for a frame n−2 by the error calculation circuit; and an error correction circuit coupled from said frame memory for receiving the effective data D of the frame n−2 and the values and positions of the corresponding errors of the fourth internal memory area.

6. An error correcting system in accordance with claim 5 wherein upon reception of a current frame n, the effective data Dn of the frame are written into one of the areas of the frame memory, while the data Dn−2 previously stored in this area, belonging to the penultimate frame n−2, are transmitted and corrected by the error correction circuit.

7. An error correcting system in accordance with claim 6 wherein the other area of the frame memory stores the effective data Dn−1 of the previous frame n−1.

8. An error correcting system in accordance with claim 5 wherein the two areas of the frame memory are used circularly, that is, the following frame n+1 is stored into the second area while frame n−1 is transmitted and corrected.

9. An error correcting system in accordance with claim 5 wherein said first and second memory areas are used circularly, that is, upon reception of frame n+1, the syndrome calculation updates the syndromes of frame n+1 in the second memory area and the error calculation circuit uses the horizontal and vertical syndromes HSn and VSn of the first memory area.

10. An error correcting system, comprising:

a first memory area for storing currently calculated horizontal syndromes HSn and vertical syndromes VSn;

a second memory area for storing the horizontal and vertical syndromes HSn−1 and VSn−1 calculated for a preceding frame n−1;

an error calculation circuit associated with said second memory area;

said second memory area also including a memory area for storing the values and positions of the errors of frame n−1 supplied from said error calculation circuit;

an input terminal for receiving an input signal including the data D of a frame to be processed, the horizontal parity data HP and the vertical parity data VP;

a syndrome calculation circuit for receiving said input signal and for storing currently calculated horizontal syndromes HSn and vertical syndromes VSn;

a frame memory for receiving said input signal and including two areas, each for storing the data D of one frame;

a correction circuit coupled from said frame memory; and a third memory area associated with said first and second memory areas and for storing the values and positions of the errors found for frame n−2 which is being transmitted and corrected by the correction circuit.

11. An error correcting system in accordance with claim 10 wherein, upon each reception of a datum of current frame n the error calculation circuit updates the corresponding horizontal and vertical syndromes in the first memory area.

12. An error correcting system in accordance with claim 11 wherein the second memory area, at the beginning of the reception of the data of frame n, contains horizontal and vertical syndromes calculated for the preceding frame n−1.

13. An error correcting system in accordance with claim 12 wherein, during the reception of frame n, the error calculation circuit successively processes the syndromes contained in the second memory area.

14. An error correcting system, comprising:

a first memory area for storing currently calculated horizontal syndromes HSn and vertical syndromes VSn;

a second memory area for storing the horizontal and vertical syndromes HSn−1 and VSn−1 calculated for a preceding frame n−1;

an input terminal for receiving an input signal including the data D of a frame to be processed, the horizontal parity data HP and vertical parity data VP;

a syndrome calculation circuit for receiving said input signal and for storing currently calculated horizontal syndromes HSn and vertical syndromes VSn;

an error calculation circuit associated with said second memory area;

a processor;

a buffer memory coupled from said error calculation circuit;

and a switch intercoupling said data input terminal, said buffer memory, and said processor.

15. An error correcting system in accordance with claim 14 further including a random access memory associated with said processor.

16. An error correcting system in accordance with claim 14 wherein, upon reception of a current frame n, the effective data Dn transmitted directly to the processor via said switch.

17. An error correcting system in accordance with claim 16 wherein said syndrome calculation circuit updates the horizontal and vertical syndromes of frame n in the first memory area, and the error calculation circuit finds the values and positions of the errors of the preceding frame n−1 based on the syndrome stored in the second memory area.

18. An error correcting system in accordance with claim 17 wherein the error values and positions are temporarily stored in the buffer memory until they have transmitted to the processor via the switch.

19. An error correcting system in accordance with claim 18 wherein said processor is programmed to store in an area of its memory current frame n and the preceding n−1 and to correct the data of the preceding frame by means of the values and positions of the errors received among the data of current frame n.

20. A method for correcting errors in a data frame including horizontal parity data enabling correction of errors in rows of the frame based on horizontal syndromes calculated on the rows, and vertical parity data enabling correction of errors in columns of the frame based on vertical syndromes calculated on the columns, the method including the steps of:

calculating, on the fly, the horizontal and vertical syndromes of a current frame based on data of the current frame being received in a slow memory and storing these syndromes in a fast memory area;

as the data of a next frame are being received in the slow memory, finding values and positions of errors of the current frame based on the syndromes stored in the fast memory area;

including the step of correcting, on the fly, the data extracted from the slow memory with found values and positions;

wherein the parity data constitute, with the remaining data, Reed-Solomon codes, each coefficient of a syndrome calculated on a row or a column of the frame being the value taken by a polynomial having coefficients constituted by the data of the row or column, for an element of a Galois field raised to a corresponding power, and wherein the vertical parity data are interlaced in the columns, the syndrome calculation including the steps of:

setting a first auxiliary register to a predetermined element of the Galois field, raised to a power corresponding to the first datum of each column;

setting a second auxiliary register to said element of the Galois field, raised to a power corresponding to the first vertical parity datum of the column;

setting to 1 a variable register;

updating the first auxiliary register with a product of its content and the inverse of said element of the Galois field upon each arrival of a new datum of the column, except upon arrival of a vertical parity datum;

updating the second auxiliary register with a product of its content and the inverse of said element of the Galois field upon each arrival of a new vertical parity datum of the column;

updating the variable register, for each syndrome coefficient, with a product of its content and the content of the second or first auxiliary register, according to whether the column datum currently received is or is not a vertical parity datum; and updating, in the fast memory area, each vertical syndrome coefficient with a sum of the syndrome coefficient and of the product of the content of the variable register by the currently received datum.

21. A method for correcting errors in a data frame including horizontal parity data enabling correction of errors in rows of the frame based on horizontal syndromes calculated on the rows, and vertical parity data enabling correction of errors in columns of the frame based on vertical syndromes calculated on the columns, the method including the steps of:

as data of a current frame are being received by rows, attempting to correct, on the fly, the rows of the current frame by means of the horizontal parity data and marking the positions of dubious rows;

calculating, on the fly, the vertical syndromes of the current frame based on the corrected and dubious rows being stored in a slow memory and storing the vertical syndromes in a fast memory area;

as data of a next frame are being received, finding values of a errors of the current frame based on the vertical syndromes stored in the fast memory area, the positions of these errors being provided by the marking of the dubious rows;

including the step of correcting, on the fly, the data extracted from the slow memory with found values and positions;

wherein the parity data constitute, with the remaining data, Reed-Solomon codes, each coefficient of a syndrome calculated on a row or a column of the frame being the value taken by a polynomial having coefficients constituted by the data of the row or column, for an element of a Galois field raised to a corresponding power, and wherein the vertical parity data are interlaced in the columns, the syndrome calculation including the steps of:

setting a first auxiliary register to a predetermined element of the Galois field, raised to a power corresponding to the first datum of each column;

setting a second auxiliary register to said element of the Galois field, raised to a power corresponding to the first vertical parity datum of the column;

setting to 1 a variable register;

updating the first auxiliary register with a product of its content and the inverse of said element of the Galois field upon each arrival of a new datum of the column, except upon arrival of a vertical parity datum;

updating the second auxiliary register with a product of its content and the inverse of said element of the Galois field upon each arrival of a new vertical parity datum of the column;

updating the variable register, for each syndrome coefficient, with a product of its content and the content of the second or first auxiliary register, according to whether the column datum currently received is or is not a vertical parity datum; and updating, in the fast memory area, each vertical syndrome coefficient with a sum of the syndrome coefficient and of the product of the content of the variable register by the currently received datum.

22. A method for correcting errors in a data frame including horizontal parity data enabling correction of errors in rows of the frame based on horizontal syndromes calculated on the rows, and vertical parity data enabling correction of errors in columns of the flame based on vertical syndromes calculated on the columns, the method including the steps of:

as data of a current frame are being received by rows, attempting to correct, on the fly, the rows of the current frame by means of the horizontal parity data and marking the positions of dubious rows;

calculating, on the fly, the vertical syndromes of the current frame based on the corrected and dubious rows being stored in a slow memory and storing the vertical syndromes in a fast memory area; and as data of a next frame are being received, finding values of a errors of the current frame based on the vertical syndromes stored in the fast memory area, the positions of these errors being provided by the marking of the dubious rows;

wherein the slow memory is managed by an exploiting circuit and the values and positions of the errors of each frame are supplied to the exploiting circuit among the data of the next frame, the exploiting circuit being adapted to store each frame and correct it upon reception of the values and positions of the corresponding errors;

wherein the parity data constitute, with the remaining data, Reed-Solomon codes, each coefficient of a syndrome calculated on a row or a column of the frame being the value taken by a polynomial having coefficients constituted by the data of the row or column, for an element of a Galois field raised to a corresponding power, and wherein the vertical parity data are interlaced in the columns, the syndrome calculation including the steps of:

setting a first auxiliary register to a predetermined element of the Galois field, raised to a power corresponding to the first datum of each column;

setting a second auxiliary register to said element of the Galois field, raised to a power corresponding to the first vertical parity datum of the column;

setting to 1 a variable register;

updating the first auxiliary register with a product of its content and the inverse of said element of the Galois field upon each arrival of a new datum of the column, except upon arrival of a vertical parity datum;

updating the second auxiliary register with a product of its content and the inverse of said element of the Galois field upon each arrival of a new vertical parity datum of the column;

updating the variable register, for each syndrome coefficient, with a product of its content and the content of the second or first auxiliary register, according to whether the column datum currently received is or is not a vertical parity datum; and updating, in the fast memory area, each vertical syndrome coefficient with a sum of the syndrome coefficient and of the product of the content of the variable register by the currently received datum.

23. A method for correcting errors in a data frame including horizontal parity data enabling correction of errors in rows of the frame based on horizontal syndromes calculated on the rows, and vertical parity data enabling correction of errors in columns of the frame based on vertical syndromes calculated on the columns, the method including the steps of:

as data of a current frame are being received by rows, attempting to correct, on the fly, the rows of the current frame by means of the horizontal parity data and marking the positions of dubious rows;

calculating, on the fly, the vertical syndromes of the current frame based on the corrected and dubious rows being stored in a slow memory and storing the vertical syndromes in a fast memory area; and as data of a next frame are being received, finding values of a errors of the current frame based on the vertical syndromes stored in the fast memory area, the positions of these errors being provided by the marking of the dubious rows;

wherein the slow memory is managed by an exploiting circuit and the values and positions of the errors of each frame are supplied to the exploiting circuit among the data of the next frame, the exploiting circuit being adapted to store each frame and correct it upon reception of the values and positions of the corresponding errors;

wherein the data frame includes error checking signatures, each of which corresponds to a remainder of a division by a generator polynomial of a polynomial having coefficients that are the bits of a series of data of the frame, including the steps of:

setting a first register, for each error found, to the coefficients of the generator polynomial and updating it with the square of its content;

setting a shift register with a position of the error in said series and clocking it synchronously with the updates of the first register; and setting a signature register to the value of the error and updating it with the product of its content and the content of the first register only when a least significant bit of the shift register is at 1, whereby the signature register contains an influence of the error upon the signature when the shift register has been fully shifted.

24. The error correction method according to any one of claims 1, 2, 20, 21, 22, or 23, wherein each frame is stored without its parity data, the values and positions of the frame error as being supplied to the exploiting circuit during reception of the parity data of the next frame.

* * * * *

UNITED STATES PATENT AND TRADEMARK OFFICE
CERTIFICATE OF CORRECTION

PATENT NO. : 6,032,283
DATED : February 29, 2000
INVENTOR(S) : Jacques Meyer

It is certified that error appears in the above-identified patent and that said Letters Patent is hereby corrected as shown below:

Column 11, line 42 should read:

nomial $\lambda(x)$ is formed by the product of terms $1 + x\alpha^p$, where

Column 12 the equations should appear as shown below:

$$\Omega(x) = (1 + x\alpha^p)\,\Omega(x)$$

$$\lambda(x) = (1 + x\alpha^p)\,\lambda(x)$$

$$\Omega_j = \Omega_j + \alpha^p\,\Omega_{j-1}$$

$$N_p = \alpha^{-p} N_p + \Omega_j$$

Signed and Sealed this

Twenty-first Day of November, 2000

Attest:

Q. TODD DICKINSON

*Attesting Officer*    *Director of Patents and Trademarks*